United States Patent
Suetinov (10) Patent No.: US 7,936,214 B2
(45) Date of Patent: May 3, 2011

(54) THIRD ORDER DERIVATIVE DISTORTION CANCELLATION FOR ULTRA LOW POWER APPLICATIONS

(75) Inventor: Viacheslav Igorevich Suetinov, Wiltshire (GB)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 12/143,623

(22) Filed: Jun. 20, 2008

(65) Prior Publication Data
US 2009/0243724 A1 Oct. 1, 2009

Related U.S. Application Data

(60) Provisional application No. 61/040,272, filed on Mar. 28, 2008.

(51) Int. Cl.
*H03F 1/26* (2006.01)
(52) U.S. Cl. .................. 330/149; 330/124 R
(58) Field of Classification Search .......... 330/149, 330/151, 295, 124 R
See application file for complete search history.

(56) References Cited

U.S. PATENT DOCUMENTS

| | | | |
|---|---|---|---|
| 5,568,094 A | 10/1996 | Bowen et al. | |
| 6,011,439 A | 1/2000 | Colarossi et al. | |
| 6,111,462 A | 8/2000 | Mucenieks et al. | |
| 7,015,751 B2 * | 3/2006 | Cavers et al. | 330/149 |
| 7,081,794 B2 | 7/2006 | Burke et al. | |
| 7,095,277 B2 * | 8/2006 | Zhou et al. | 330/149 |
| 7,110,739 B2 * | 9/2006 | Braithwaite | 455/276.1 |
| 7,312,660 B2 * | 12/2007 | Koh et al. | 330/260 |
| 7,696,828 B2 * | 4/2010 | Chang | 330/311 |
| 2004/0085132 A1 | 5/2004 | Pengelly et al. | |
| 2005/0176399 A1 | 8/2005 | Aparin | |

OTHER PUBLICATIONS

T.W. Kim, B. Kim, K. Lee, "Highly Linear Receiver Front-End Adopting MOSFET Transconductance Linearization by Multiple Gated Transistors". IEEE Journal on Solid State Circuits, vol. 39, pp. 223-229, No. 1, 2004.

Popa, C. et al , "A New Linearization Technique for a CMOS Differential Amplifier Using Bulk-Driven Weak Inversion MOS Transistors", Signals, Circuits and Systems, 2003, International Symposium on Jul. 10-11, 2003, vol. 2, Piscataway, NJ, USA, pp. 589-592.

Yong-Sik. Youn, et al., "A 2GHz 16dBm IIP3 low noise amplifier in 0.25/spl mu/m CMOS Technology", Solid-State Circuits Conference, 2003, Digest of Technical Papers, San Francisco, CA, USA, pp. 1-10.

(Continued)

*Primary Examiner* — Henry K Choe
(74) *Attorney, Agent, or Firm* — Stephen W. Bauer; Michael J. Ostrom (57) ABSTRACT

An apparatus and method for the cancellation of third order derivative distortion for ultra low power (ULP) applications are disclosed involving a first amplifier connected in parallel with a second amplifier for amplifying a received signal. The first amplifier includes at least one transistor operating in the sub-threshold region such that the first amplifier possesses a positive third derivative of a transfer function of the first amplifier, which generates a first amplified signal having in phase third order distortions. The second amplifier includes at least one differential pair of transistors operating in the sub-threshold region such that the second amplifier possesses a negative third derivative of a transfer function of the second amplifier, which generates a second amplified signal having in opposite phase third order distortions. The first and second amplified output signals are combined resulting in cancellation of third order distortions in the combined amplified signal.

19 Claims, 5 Drawing Sheets

OTHER PUBLICATIONS

Tae Wook, Kim, et al., "A 13-dB IIP3 Improved Low-Power CMOS RF Programmable Gain Amplifier Using Differential Circuit Transconductance Linerarization for Various Terrestrial Mobile D-TV Applications", IEEE Journal of Solid-State Circuits, Piscataway, NJ, USA, Apr. 2006, vol. 41, No. 4, pp. 945-953.

Guochi, Huang et al., "Post Linearization of CMOS LNA Using Double Cascade FETs", Circuits and Systems, 2006, IEEE International Symposium on, IEEE, Piscataway, NJ, USA, May 2006, pp. 4499-4502.

Aparin, V., et al., "Linearization of CMOS LNA's Via Optimum Gate Biasing", Circuits and Systems, 2004, Proceedings of the 2004 International Symposium on Vancouver, BC, Canada, May 2004, Piscataway, NJ, USA, pp. 748-751.

International Search Report, PCT/US2009/036790, 4 pages.

* cited by examiner

THIRD ORDER DERIVATIVE DISTORTION CANCELLATION FOR ULTRA LOW POWER APPLICATIONS

RELATED APPLICATIONS

This application claims the benefit of and priority to U.S. Provisional Application Ser. No. 61/040,272, filed Mar. 28, 2008, entitled, "Third Order Derivative Distortion Cancellation for Ultra Lower Power Applications," the contents of which are incorporated by reference herein in its entirety.

BACKGROUND OF THE DISCLOSURE

The present disclosure relates to cancellation of third order derivative distortion. In particular, it relates to cancellation of third order derivative distortion for ultra low power (ULP) applications.

SUMMARY OF THE DISCLOSURE

The present disclosure relates to an apparatus and method for the cancellation of third order derivative distortion for ULP applications. In one or more embodiments, the apparatus and method for canceling third order derivative distortion involve amplifying a received signal using a first amplifier arranged in parallel with a second amplifier.

The first amplifier includes at least one active electronic device for amplifying the received signal in the sub-threshold region and as a result the first amplifier possesses a positive third derivative of a transfer function of the first amplifier to generate a first amplified signal having in phase third order distortions.

The second amplifier arranged in parallel to the first amplifier includes at least one differential pair of electronic devices for amplifying the received signal in the sub-threshold region and as a result the second amplifier possesses a negative third derivative of a transfer function of the second amplifier to generate a second amplified signal having in opposite phase third order distortions. The first and second amplified output signals are combined, which results in the cancellation of the third order distortions in the combined signal.

In one or more embodiments, a bias current of the second amplifier is adjusted so that the third order distortions in the second amplified signal are equal in amplitude and opposite in phase to the third order distortions of the first amplified signal. The active electronic devices (e.g., CMOS transistors) of the first and second amplifiers operate in the sub-threshold region allowing low current consumption required by ULP devices, while the combined output signal of both amplifiers has significantly less distortions than each amplifier individually due to the distortion cancellation that is achieved. In one or more embodiments, the first amplifier is employed as a main amplifier, and the second amplifier is employed as an auxiliary amplifier.

In one or more embodiments, the apparatus and method for canceling third order derivative distortion involve connecting a differential pair of active electronic devices connected in parallel with a main active electronic device for amplifying a received signal. The differential pair of active electronic devices and the main active electronic device are arranged to share a common load. The main active electronic device possesses a positive third order derivative of a transfer function of the main active electronic device operating in a sub-threshold region, such that the main active electronic device is configured to generate a first amplified signal having third order distortions in phase with the first amplified signal. The differential pair of active electronic devices possesses a negative third order derivative of a transfer function of the differential pair of active electronic devices operating in the sub-threshold region, such that the differential pair of active electronic devices are configured to generate a second amplified signal having third order distortions in the sub-threshold region in opposite phase of the second amplified signal. The first and second amplified output signals output by the differential pair of active electronic devices and the main active electronic device are combined resulting in cancellation of the third order distortions in the combined signal.

In one or more embodiments, a bias current of the differential pair of active electronic devices is adjustable so that the negative third order distortions of the second amplified signal output by the differential pair of active electronic devices are equal in amplitude and opposite in phase to the positive order distortions of the first amplified signal output by the main active electronic device. In one or more embodiments, the differential pair of active electronic devices comprise a differential pair of transistors (e.g., CMOS transistors) while the main active electronic device comprises at least one transistor.

BRIEF DESCRIPTION OF THE DRAWINGS

These and other features, aspects, and advantages of the present disclosure will become better understood with regard to the following description, appended claims, and accompanying drawings where:

DETAILED DESCRIPTION

The methods and apparatus disclosed herein provide an operative system for the cancellation of third order derivative distortion. Specifically, this system allows for the cancellation of third order derivative distortion in amplifiers used in ULP applications.

Amplifiers used in ULP applications employ active electronic devices operating under very low bias conditions. Since the bias conditions are low, the transfer function characteristics of ULP amplifiers tend to be rather nonlinear, This nonlinearity results in significant inter-modulation distortions produced at the output of the amplifier. These resultant inter-modulation distortions have the detrimental effects of limiting the amplifier's sensitivity in the presence of blockers as well as limiting the dynamic range of the input signal. The system of the present disclosure helps to minimize the problematic resultant inter-modulation distortions by cancelling the third order derivative distortion products while achieving low current consumption required of ULP applications.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
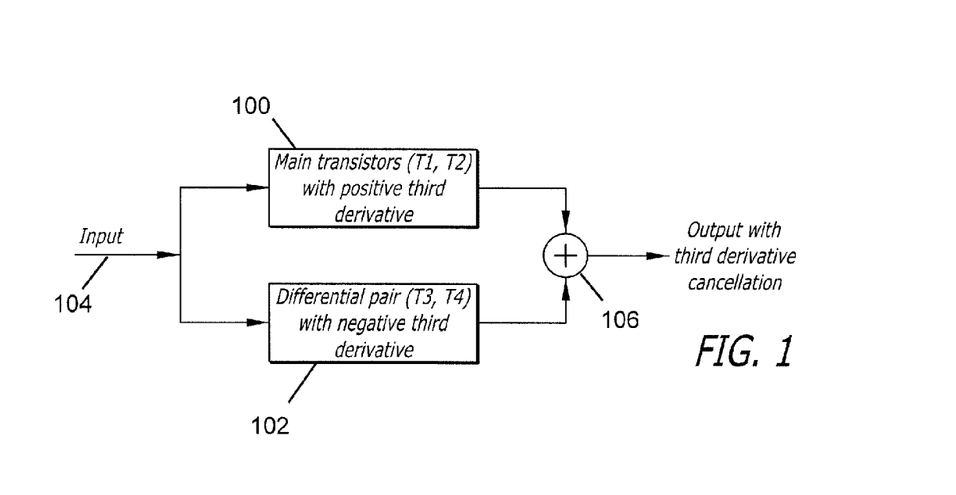
FIG. 1 is a block diagram representation of a method for cancellation of third order derivative distortion in accordance with one embodiment of the present disclosure.

FIG. 1 contains a block diagram that illustrates the cancellation of the third order derivative distortion in accordance with one or more embodiments of the present disclosure. In this block diagram, a first amplifier 100 is connected in parallel with a second amplifier 102 for amplifying a received signal through input 104. The first amplifier 100 and the second amplifier 102 are arranged to share a common load. In one or more embodiments, the first amplifier 100 includes main transistors (T1, T2) for generating a first amplified signal of the input signal 104, and the second amplifier 102 includes a differential pair of transistors (T3, T4) for generating a second amplified signal of the input signal 104. A summing device 106 combines the first and second amplified output signals output by the first amplifier 100 and the second amplifier 102.

The transfer function of a transistor is represented by its drain current versus gate voltage. The threshold voltage of a transistor is the voltage at which a solid conducting path is established between the transistor's source and drain. The third derivative of the transfer function of a transistor is a function that has value and sign. Third order distortion is a signal that has frequency, amplitude, and phase.

In the embodiments associated with FIG. 1, the third derivative of the transfer function of the output of the main transistors (T1, T2) is positive in sign when the main transistors (T1, T2) are operating in the sub-threshold region, while the third derivative of the transfer function of the output of the differential pair of transistors (T3, T4) is negative in sign when the differential pair of transistors (T3, T4) is operating in the sub-threshold region. The third derivative of the transfer function of a transistor causes third order distortions in the transistor's output signal. Thus, the sign of the third derivative of the transfer function defines the phase of the third order distortions. As such, the positive third order derivative of the main transistors (T1, T2) generates third order distortions that are in phase with the first amplified signal, while the negative third order derivative of the differential pair of transistors (T3, T4) generates third order distortions that are in opposite phase with the second amplified signal.

In one or more embodiments, the bias current of differential pair of transistors (T3, T4) is adjusted such that the third derivative of the transfer function of the output of the differential pair of transistors (T3, T4) is substantially equal in value to third derivative of the transfer function of the output of the main transistors (T1, T2). Therefore, since the third derivative of the transfer function of the output of the main transistors (T1, T2) is equal in value and opposite in sign to the third derivative of the transfer function of the output of the differential pair of transistors (T3, T4), the third order distortions in the second amplified signal cancel the third order distortions in the first amplified signal when they are combined by summing device 106, thereby resulting in cancellation of the third order distortions in the combined signal.

Since third order distortions are cancelled in the combined amplified signal when all of the active electronic devices are operating in the sub-threshold region, linearity in the combined amplifier device is achieved while consuming a low total amount of current. While the first amplifier 100 is illustrated in FIG. 1 as including two main transistors (T1, T2), it is understood that the first amplifier 100 may comprise any active electronic device having a positive third derivative of the transfer function when the device is operating in the sub-threshold region. Thus, any type of such active electronic device can be utilized for first amplifier 100 including, but are not limited to, various types of amplifiers, including radio frequency (RF) amplifiers, as well as various types of transistors and combinations of transistors, including CMOS transistors (NMOS and PMOS transistors) and other Field Effect Transistors (FETs).

Figure 2:
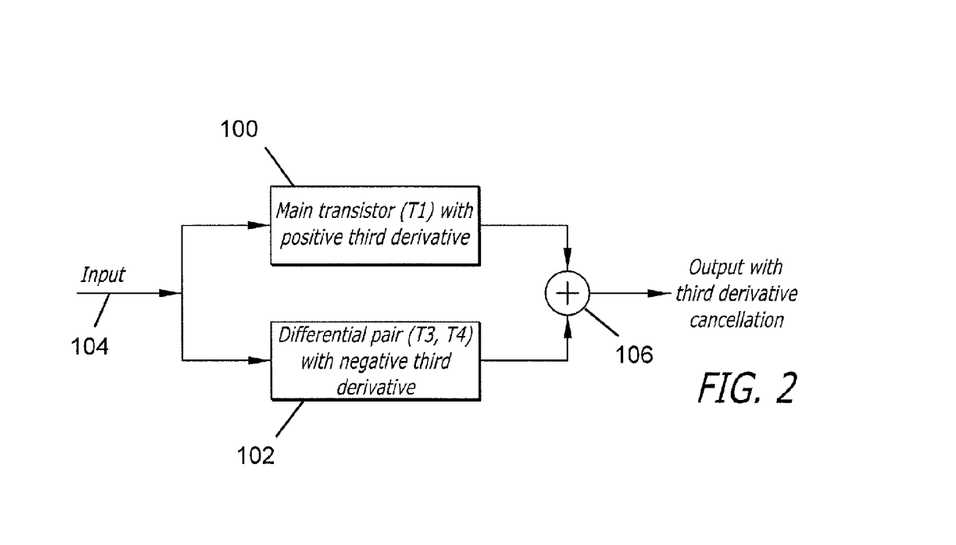
FIG. 2 is a block diagram representation of a method for cancellation of third order derivative distortion in accordance with another embodiment of the present disclosure.

For example, FIG. 2 illustrates a block diagram that depicts the cancellation of the third order derivative distortion in accordance with one or more embodiments of the present disclosure in which the first amplifier 100 includes only a single main transistor (T1), as compared to the block diagram in FIG. 1 which illustrates two main transistors (T1, T2). In the block diagram of FIG. 2, the output of the main transistor (T1) is summed with the output of the differential pair of transistors (T3, T4). In this embodiment, the third derivative of the transfer function of the output of the main transistor (T1) is positive in sign, while the third derivative of the transfer function of the output of the differential pair of transistors (T3, T4) is negative in sign. The differential pair of transistors (T3, T4) is biased such that the third derivative of the transfer function of the output of the differential pair of transistors (T3, T4) is equal in value to the third derivative of the transfer function of the output of the main transistor (T1). Thus, since the third derivative of the transfer function of the output of the main transistor (T1) is equal in value and opposite in sign to the third derivative of the transfer function of the output of the differential pair of transistors (T3, T4), the total output third order derivative distortion is cancelled.

Figure 3:
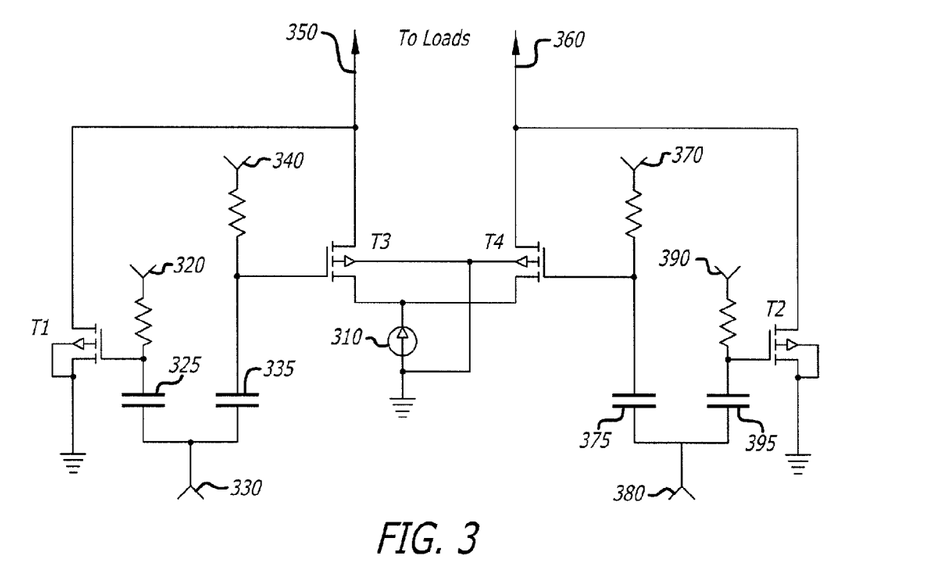
FIG. 3 is a schematic circuit diagram for canceling third order derivative distortion in accordance with at least the embodiment illustrated in FIG. 1.

FIG. 3 shows a circuit diagram in accordance with one or more embodiments which employ a plurality of transistors in the first amplifier 100 (such as illustrated in FIG. 1) in which plurality of transistors are arranged in a differential input configuration. This differential input configuration includes two voltage inputs, Vinp 330 and Vinn 380. The diagram in FIG. 3 shows a first amplifier (T1, T2) being connected in parallel with a second amplifier (T3, T4), where both amplifiers (T1, T2 and T3, T4) share a common load. In this embodiment, the first amplifier consists of a pair of transistors (T1, T2). Also in this embodiment, the second amplifier consists of two transistors (T3, T4) that are connected in a differential pair configuration. Transistors (T3, T4) are used for third order distortion compensation but they also provide additional signal amplification so that no current is wasted.

In one or more embodiments, T1 and T2 represent the main transistors of the first amplifier 100, and T3 and T4 represent the differential pair of transistors of the second amplifier 102. In the circuit diagram of FIG. 3, the T1, T2, T3, and T4 transistors are depicted as NMOS transistors. However, alternatively, other electrical devices that have similar third order derivative distortion cancellation properties to NMOS transistors may be used for this embodiment. Some examples of other types of electrical devices that may be used include, but are not limited to, various types of amplifiers, including RF amplifiers, as well as various types of transistors including CMOS and PMOS transistors and other Field Effect Transistors (FETs).

During operation of this embodiment, the bias voltages for the main transistors (T1 and T2) and the differential pair of transistors (T3 and T4) are adjusted such that all the transistors (T1, T2, T3, and T4) are operating in the active sub-threshold region. The bias voltage Vb1 320, 390 for the main transistors (T1 and T2) is the direct current (DC) voltage that defines the operating point of the main transistors (T1 and T2). The Vb1 320, 390 voltages operate in the sub-threshold region below the threshold voltage of the main transistors (T1 and T2) in order to provide a third order derivative with a positive sign.

The bias voltage Vb2 340, 370 for the differential pair of transistors (T3 and T4) is the DC voltage that defines the operating point of the differential pair transistors (T3 and T4). The Vb2 340, 370 voltages must be high enough to provide for proper operation of the current source 310 in the presence of the input signals, Vinp 330 and Vinn 380. The value of the negative third order derivative of the differential pair transistors (T3 and T4) is defined by the value of the tail current 310. The bias current of the differential pair transistors (T3 and T4) is adjusted such that the negative third order derivative produced by the differential pair transistors (T3 and T4) is equal in value of the positive third order derivative produced by the main transistors (T1 and T2), thereby canceling the positive third order derivative produced by the main transistors (T1 and T2) when the outputs of the first amplifier 100 (T1 and T2) and the second amplifier (T3 and T4) are combined.

Input signals, Vinp 330 and Vinn 380, are applied via coupling capacitors 325, 335, 375, 395 for the main transistors (T1 and T2) and the differential pair transistors (T3 and T4). Output signals, Voutn 350 and Voutp 360, can be applied to the load directly or alternatively via cascode transistors for excluding harmonic feedback in the combined signal.

Figure 4:
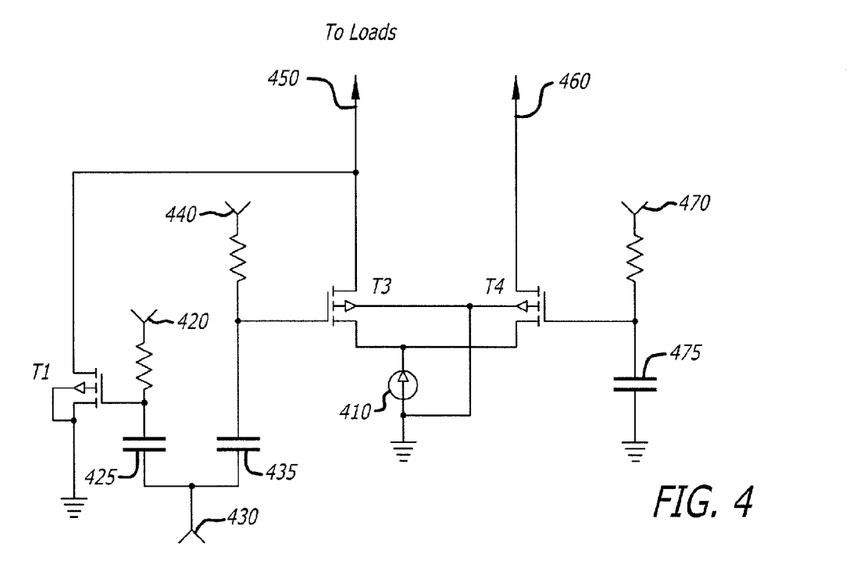
FIG. 4 is a schematic circuit diagram for canceling third order derivative distortion in accordance with at least the embodiment illustrated in FIG. 2.

FIG. 4 shows a circuit diagram in accordance with one or more embodiments which employ a single ended transistor configuration in the first amplifier 100 (such as illustrated in FIG. 2). This single ended configuration includes a single voltage input, Vin 430. The diagram in FIG. 4 shows a first amplifier (T1) connected in parallel with a second amplifier (T3, T4), where both amplifiers (T3, T4 and T1) share a common load. The first amplifier of this embodiment consists of one transistor (T1). The second amplifier of this embodiment consists of a differential pair of transistors (T3, T4) that are used for third order distortion compensation and additional signal amplification.

In the circuit diagram of FIG. 4, T1 represents the main transistor, and T3 and T4 represent the differential pair of transistors. While T1, T3, and T4 transistors are specifically depicted as NMOS transistors, it is understood that other electrical devices that have similar third order derivative distortion cancellation properties to NMOS transistors may be used instead of NMOS transistors for this embodiment. Some examples of other types of electrical devices that may be used include, but are not limited to, various types of amplifiers, including RF amplifiers, as well as various types of transistors including PMOS transistors and other FETs.

During operation of the embodiment illustrated in FIG. 4, the bias voltages for the main transistor (T1) and the differential pair of transistors (T3 and T4) are adjusted such that the transistors (T1, T3, and T4) are all operating in the active sub-threshold region. The bias voltage Vb1 420 for the main transistor (T1) is the DC voltage that defines the operating point of the main transistor (T1). The Vb1 420 voltage must be below the threshold voltage of the main transistor (T1) in order to provide the positive sign of the third order derivative.

The bias voltage Vb2 440, 470 for the differential pair of transistors (T3 and T4) is the DC voltage that defines the operating point of the differential pair transistors (T3 and T4). The Vb2 440, 470 voltages must be high enough to provide for proper operation of the current source 410 in the presence of the input signal, Vin 430. The value of the negative third order derivative of the differential pair transistors (T3 and T4) is defined by the value of the tail current 410.

The non-inverting output of the differential pair of transistors (T3 and T4) is connected to the supply rail VDD 460. The bias current of the differential pair transistors (T3 and T4) is adjusted such that the negative third order derivative produced by the differential pair transistors (T3 and T4) cancels the positive third order derivative produced by the main transistor (T1).

The input signal, Vin 430 is applied via the coupling capacitors 425, 335, 475 for the main transistor (T1) and the differential pair transistors (T3 and T4). In addition, the output single ended signal, Vout 450 can be applied to the load directly or alternatively via cascode transistors for excluding harmonic feedback in the combined signal.

Figure 5A:
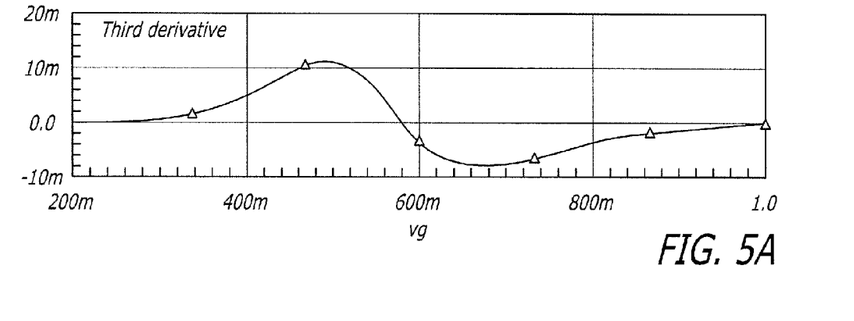
FIG. 5A is a graphical representation of the third derivative of the transfer function of a NMOS transistor illustrated in FIG. 5C.
Figure 5B:
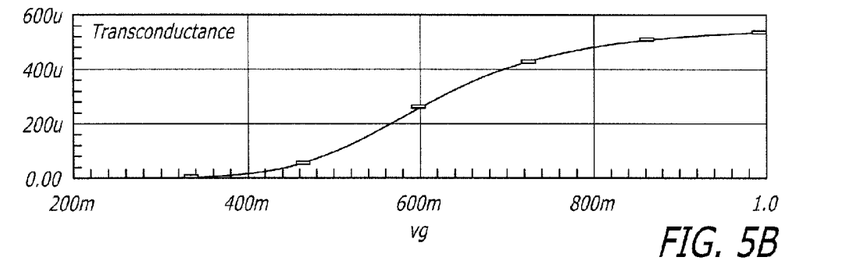
FIG. 5B is a graphical representation of the first derivative of the transfer function of a NMOS transistor illustrated in FIG. 5C.
Figure 5C:
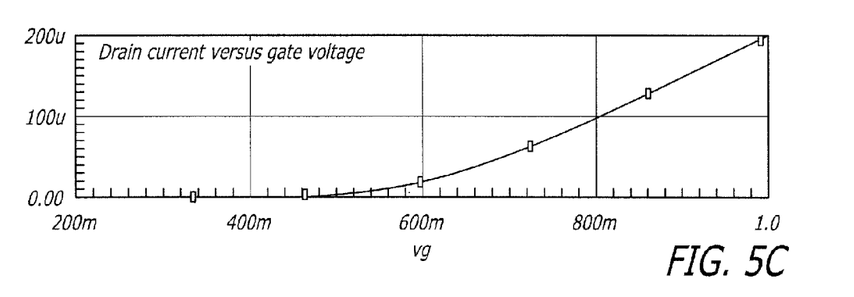
FIG. 5C is a graphical representation of the transfer function of a NMOS transistor operating in accordance with one embodiment of the present disclosure.

FIGS. 5A, 5B, and 5C show the characteristics of a single NMOS transistor with a channel width of 1 micro meter (μm) that could be utilized as one of the transistors in various embodiments of the present disclosure. These figures are used to illustrate that when a single NMOS transistor is operating in the sub-threshold region, the third derivative of the transfer function is significant and must be compensated. In various embodiments of the present disclosure, including those associated with FIGS. 2 and 4 utilizing a single transistor (T1) in the main amplifier 100, the single NMOS transistor is operating in the region where the gate voltage is rather low and the third derivative of the transfer function is positive.

FIG. 5C shows the transfer function, or drain current versus gate voltage, of the single NMOS transistor with a channel width of 1 μm. In this representative depiction, the horizontal axis shows gate voltage in milli volts (mV) and the vertical axis depicts the drain current in micro amps (μA). FIG. 5B depicts the first derivative of the transfer function, or transconductance, of the same single NMOS transistor. FIG. 5A illustrates the third derivative of the transfer function of the same single NMOS transistor. It can be seen that in the sub-threshold region (e.g., less than 450 mV), the third derivative of the transfer function is positive. During operation of one or more embodiments of the present disclosure, the single NMOS transistor, which is employed as the single main transistor (T1), will be biased to operate in the sub-threshold region where the third derivative is positive in sign, and will be scaled in transistor width to the required transconductance.

Figure 6A:
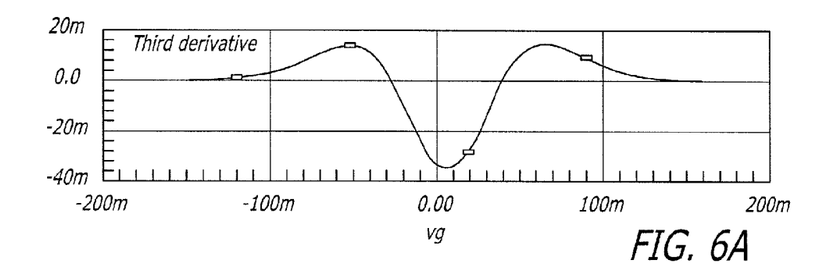
FIG. 6A is a graphical representation of the third derivative of the transfer function of a differential pair of NMOS transistors illustrated in FIG. 6C.
Figure 6B:
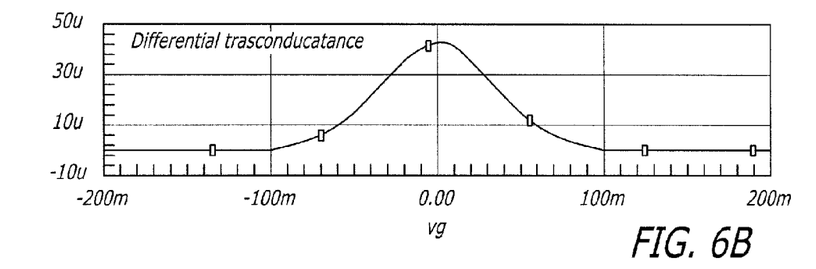
FIG. 6B is a graphical representation of the first derivative of the transfer function of a differential pair of NMOS transistors illustrated in FIG. 6C.
Figure 6C:
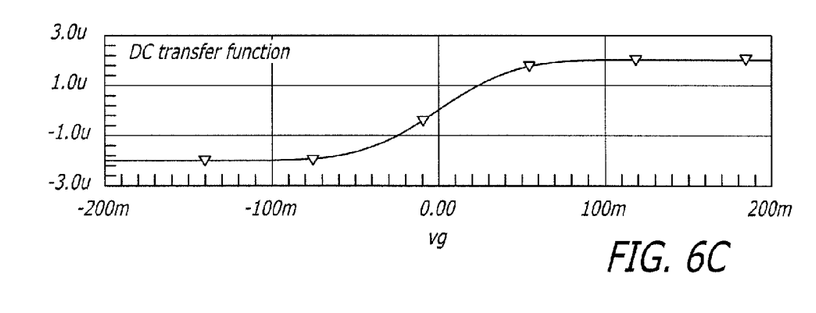
FIG. 6C is a graphical representation of the transfer function of a differential pair of NMOS transistors operating in accordance with one embodiment of the present disclosure.

FIGS. 6A, 6B, and 6C show the characteristics of a differential pair of NMOS transistors with a channel width of 1 μm biased to operate in the sub-threshold region that could be utilized as the transistors in various embodiments of the present disclosure. In various embodiments of the present disclosure, including those associated with FIGS. 1 and 3 utilizing a differential pair of transistors (T3 and T4) of the required width in the second or auxiliary amplifier 102, the differential pair of NMOS transistors are operating in the region where their gate voltage is rather low but the third derivative of their transfer function is negative.

FIG. 6C depicts the DC transfer function of a differential pair of NMOS transistors with a channel width of 1 μm and a tail current of 6 μA. The horizontal axis shows gate voltage in milli volts and the vertical axis is DC transfer function in micro amps. FIG. 6B is the first derivative of FIG. 6A and illustrates differential tranconductance, or potential gain, of the differential pair of NMOS transistors. FIG. 6A illustrates the third derivative of the transfer function of FIG. 6C. The third derivative of the transfer function of the differential pair of NMOS transistors functions is negative independently of bias current and, thus, the negative third derivative of the differential pair will compensate for and cancel the positive third derivative of the single NMOS transistor (shown in FIG. 5C) operating as the main transistor if the tail current 410 has the appropriate value.

Figure 7A:
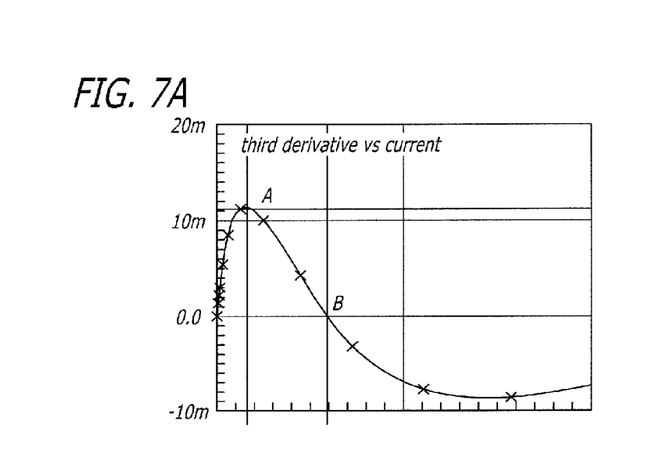
FIG. 7A is a graphical representation of the third derivative of the transfer function of the output of a circuit in the configuration of FIG. 4 of the present disclosure implemented with NMOS transistors.
Figure 7B:
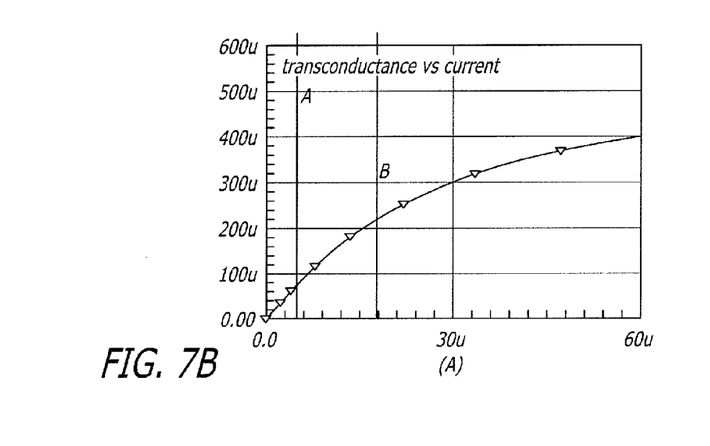
FIG. 7B is a graphical representation of the first derivative of the transfer function of the output of a circuit in the configuration of FIG. 4 of the present disclosure implemented with NMOS transistors.

In accordance with one or more embodiments, FIGS. 7A and 7B show the device characteristics for the representative embodiment discussed above in connection with FIGS. 5A-5C of the NMOS transistor characteristics. FIG. 7A illustrates the third derivative of the transfer function of the NMOS transistor with a channel width of 1 μm versus current. (FIG. 5A depicts the same characteristic versus voltage.) In FIG. 7A, the horizontal axis shows the bias current of the NMOS transistor in micro amps and the vertical axis shows the third derivative in milli amps/volts$^3$ (mA/V$^3$).

FIG. 7B shows the first derivative of the transfer function, or transconductance, of the NMOS transistor with a channel width of 1 μm versus bias current. (FIG. 5B depicts the same characteristic versus voltage.) The horizontal axis shows the bias current of NMOS transistors in micro amps and the vertical axis is the transconductance in mA/V. The usage of the operating point B where the third derivative is approximately zero to minimize the output distortion is not desirable since the second derivative has a maximum at this point, and as a result, the second order distortions achieve a maximum value.

Figure 8A:
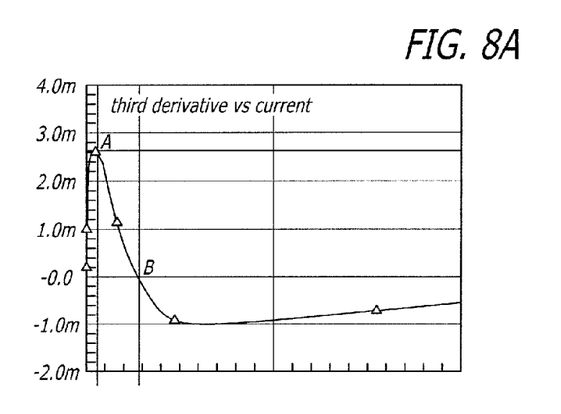
FIG. 8A is a graphical representation of the third derivative of the transfer function of the output of a circuit in the configuration of FIG. 4 of the present disclosure implemented with PMOS transistors.
Figure 8B:
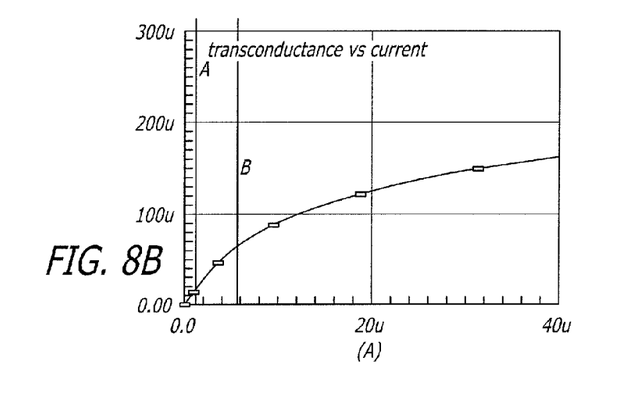
FIG. 8B is a graphical representation of the first derivative of the transfer function of the output of a circuit in the configuration of FIG. 4 of the present disclosure implemented with PMOS transistors.

In accordance with one or more embodiments, FIGS. 8A and 8B show the device characteristics for the representative embodiment discussed above employing a PMOS transistor rather than a NMOS transistor. FIGS. 8A and 8B depict graphical representations of the third derivative and transconductance, respectively, of the PMOS transistor with a channel width of 1 μm versus bias current.

As set forth herein, the methods and apparatus described allow for the cancellation of third order derivative distortion in amplifiers used in ULP applications. For example, the described methods and apparatus can be utilized in a LNA or other signal receiving circuitry in an implantable medical device (IMD). IMDs often employ telemetry modules to communicate information or instructions from external medical devices to the IMD. However, since the battery capacity in an IMD is very limited, the power consumed by the components of the IMD must be conserved by operating the IMD under ULP conditions. Thus, the methods and apparatus for canceling third order derivative distortion described in various embodiments herein can be utilized in the receiving circuitry of an IMD to enable the IMD to amplify received telemetry signals while operating under ULP conditions.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method of cancelling third order distortion for ultra low power applications comprising:
   receiving a signal to be amplified;
   operating a first amplifier including at least one active electronic device in a sub-threshold region for amplifying the received signal, wherein the first amplifier possesses a positive third derivative of a transfer function of the first amplifier to generate a first amplified signal having in phase third order distortions;
   operating a second amplifier including at least one differential pair of active electronic devices in a sub-threshold region for amplifying the received signal, where the second amplifier is arranged in parallel to the first amplifier, and wherein the second amplifier possesses a negative third derivative of a transfer function of the second amplifier to generate a second amplified signal having in opposite phase third order distortions;
   combining the first and second amplified output signals resulting in cancellation of the third order distortions in the combined signal.

2. The method of claim 1, further comprising adjusting a bias current of the second amplifier so that the third order distortions in the second amplified signal are equal in amplitude and opposite in phase to the third order distortions of the first amplified signal.

3. The method of claim 1, further comprising operating the first amplifier as a main amplifier and the second amplifier as an auxiliary amplifier.

4. The method of claim 1, wherein the at least one differential pair of active electronic device of the second amplifier comprises a differential pair of CMOS transistors; and wherein the at least one active electronic device of the first amplifier comprises at least one CMOS transistor.

5. The method of claim 1, further comprising receiving the signal to be amplified from coupling capacitors for the first and second amplifiers.

6. The method of claim 1, wherein the first and second amplifiers are radio frequency amplifiers.

7. An apparatus for cancelling third order derivative distortion for ultra low power applications comprising:
   a first amplifier including at least one active electronic device connected in parallel with a second amplifier including at least one differential pair of active electronic devices for amplifying a received signal;
   the first amplifier possessing a positive third derivative of a transfer function of the first amplifier when the active device operating in a sub-threshold region for generating a first amplified signal having in phase third order distortions;
   the second amplifier possessing a negative third derivative of a transfer function of the second amplifier when the differential pair operating in a sub-threshold region for generating a second amplified signal having in opposite phase third order distortions; and a summing device for combining the first and second amplified output signals output by the first amplifier and the second amplifier resulting in cancellation of the third order distortions in the combined signal.

8. The apparatus of claim 7, further comprising an adjustable bias current of the second amplifier that is adjustable so that the third order distortions of the second amplifier are equal in amplitude and opposite in phase to the third order distortions of the first amplifier.

9. The apparatus of claim 7, further comprising operating the first amplifier as a main amplifier and the second amplifier as an auxiliary amplifier.

10. The apparatus of claim 7, wherein the at least one differential pair of active electronic device of the second amplifier comprises a differential pair of CMOS transistors; and wherein the at least one active electronic device of the first amplifier comprises at least one CMOS transistor.

11. The apparatus of claim 7, further comprising coupling capacitors connected to the first and second amplifiers through which the signal to be amplified is passed.

12. The apparatus of claim 7, wherein the first and second amplifiers are radio frequency amplifiers.

13. The apparatus of claim 7, further comprising a cascode transistor configuration connected to the summing device for excluding harmonic feedback in the combined signal.

14. An apparatus for cancelling third order derivative distortion for ultra low power applications comprising:

a main transistor means connected in parallel with an auxiliary transistor means for amplifying a received signal;

the main transistor means operating in a sub-threshold region such that the main transistor means possesses a positive third derivative of a transfer function of the main transistor means to generate a first amplified signal having in phase third order distortions;

the auxiliary transistor means operating in a sub-threshold region such that the auxiliary transistor means possesses a negative third derivative of a transfer function of the auxiliary transistor means to generate a second amplified signal having in opposite phase third order distortions;

a summing means for combining the first and second amplified output signals output by the main transistor means and the auxiliary transistor means resulting in cancellation of the third order distortions in the combined signal.

15. The apparatus of claim 14, further comprising an adjustable bias current means for adjusting a bias current of the auxiliary transistor means so that the third order distortions of the second amplified signal are equal in amplitude and opposite in phase to the third order distortions of the first amplified signal.

16. The apparatus of claim 14, wherein the auxiliary transistor means comprises a differential pair of CMOS transistors; and wherein and the main transistor means comprises at least one CMOS transistor.

17. The apparatus of claim 14, further comprising receiving the signal to be amplified from coupling capacitors for the main transistor means and the auxiliary transistor means.

18. The apparatus of claim 14, wherein the main transistor means and the auxiliary transistor means are radio frequency amplifiers.

19. The apparatus of claim 14, further comprising a cascode transistor means connected to the summing means for excluding harmonic feedback in the combined signal.

* * * * *